Figure 1:
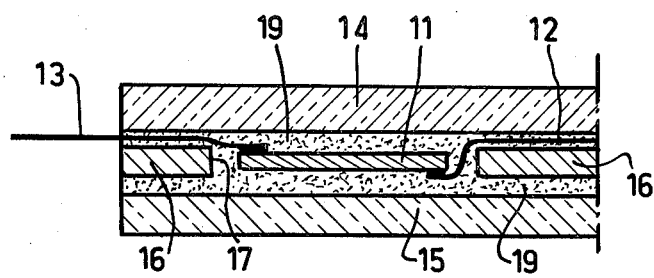

United States Patent

Tourneux

[11] 4,210,462
[45] Jul. 1, 1980

[54] GENERATOR PANEL HAVING SOLAR CELLS INCORPORATED IN A LAMINATED ASSEMBLY

[75] Inventor: Michel Tourneux, Velizy, France

[73] Assignee: U.S. Philips Corporation, New York, N.Y.

[21] Appl. No.: 903,052

[22] Filed: May 5, 1978

[30] Foreign Application Priority Data

Jun. 24, 1977 [FR] France .................. 77 19435

[51] Int. Cl.$^2$ ........................................... H01L 31/04
[52] U.S. Cl. ........................ 136/89 EP; 156/286
[58] Field of Search ............... 136/89 H, 89 P, 89 EP

[56] References Cited

U.S. PATENT DOCUMENTS

| | | | |
|---|---|---|---|
| 3,957,537 | 5/1976 | Baskett et al. ...................... | 136/89 |
| 4,067,764 | 1/1978 | Walker et al. ...................... | 156/267 |

Primary Examiner—Aaron Weisstuch
Attorney, Agent, or Firm—Thomas A. Briody; William J. Streeter; Rolf E. Schneider

[57] ABSTRACT

A photovoltaic generator panel comprising a plurality of solar cells incorporated in a laminated assembly, each of the external faces of which is formed of a glass plate. The laminated assembly comprises an inset plate formed of a transparent synthetic resin stable at elevated temperatures and provided with a recess for each solar cell. Optionally, an inset film preferably formed of the same transparent synthetic resin can be positioned between the inset plate and one or both glass plates. Assembly of these several lamellar elements is effected by the use of a transparent adhesive polymerized at a temperature below 70° C.

6 Claims, 5 Drawing Figures

GENERATOR PANEL HAVING SOLAR CELLS INCORPORATED IN A LAMINATED ASSEMBLY

This invention relates to a photovoltaic generator panel comprising a number of solar cells incorporated in a laminated assembly, in which each of the outer faces of said assembly consists of a plate of a vitreous material.

This invention also relates to a method of manufacturing such a panel.

It is known that commercially available solar cells usually include a slice or layer of a semiconductor material, for example, silicon, in which a superficial and thin electric region is produced, the conductivity type of which is opposite to that of the remainder of the material with which said superficial region forms a photosensitive junction. A solar cell which is provided with a suitable metal contact on each of its surfaces is characterized by its capability to convert an appreciable fraction of the energy which it receives by exposure to the sun into electrical energy. As a rule, several solar cells are arranged in the form of a panel in such a manner that, when the cells are exposed simultaneously, the desired amount of power is obtained.

For terrestrial applications, taking into account the high environmental constraints to which solar cells are exposed as a result of very different weather influences, it is usual that the encapsulation of the cells in the form of generator panels ensures both a mechanical connection for the assembly of the cells and also a support for the required electrical connections as well as protection against shocks, mechanical loads, especially bending loads, and corrosion, which particularly influences the metallized contacts due to the influence of humidity.

Several constructions of solar generator panels have been proposed, in which it has been attempted to achieve maximum cell protection. In one such construction the cells are arranged in a cup of polycarbonate, which is filled with a transparent silicone resin. In a modification, the support for the rear face of the cells is formed by a plate of a synthetic resin coated with glass fibers, analogous to those used for printed circuits, in which the cells are secured on said plate by soldering of the connections, the assembly being then covered with a layer of a silicone resin. However, the generator panels so obtained do not have very good resistance to the effects of weather. Furthermore, because the coefficient of thermal dissipation of said panels is not favorable for efficacious cooling, there is the disadvantage that the cells, during operation, may reach a temperature which exceeds the ambient temperature, whereby a considerable reduction in the degree of conversion results.

A proposal to eliminate this disadvantage is described in U.S. Pat. No. 3,957,537. According to such disclosure, the solar cells are incorporated in a laminated assembly, of which at least one of the two external plates ensures the rigidity of the assembly, the assembling being carried out by means of a molten adhesive. Glass plates or plates of a vitreous material are preferably used to form the external lamellar elements.

However, the above-described system presents certain disadvantages. Thus, the rise in temperature of the panel with respect to the ambient air due to direct exposure to sunlight and according to the disposition of the cells inside the panel, which is jointed, may be estimated between 15° and 25° C. The maximum temperature reached by the panel also depends on the highest temperature of the ambient air at the location of the panel. This temperature may be comparatively high because the applications of solar energy in tropical areas of the earth where the highest temperatures may be 40° to 50° C. are of importance. It can be established that under the same severe operating conditions the prior art thermoplastic products which are used as adhesives to bind together the laminated assembly are softened to a considerable extent, a result unfavorable for the good cohesion of the panel. Moreover, due to the high day-time temperatures followed by low night-time temperatures and the resultant expansion and contraction, there is an increase in the rate of fatigue of the panel, as a result of which the properties and the performances of the panel deteriorate due to working loose of parts and infiltration at the circumference thereof.

One of the objects of the present invention is to reduce these disadvantages by improvement in the encapsulation of the cells while using a laminated assembly with external surfaces of a vitreous material. According to the invention, an adhesive is used which remains insensitive to the temperature changes occurring under practical operating conditions and by means of which the laminated assembly can be assembled at a temperature which lies near the ambient temperature.

More particularly, according to the invention, a photovoltaic generator panel comprising a number of solar cells incorporated in a laminated assembly, which assembly is formed from lamellar elements by means of a transparent adhesive, those elements forming the two external surfaces being constituted by plates of a vitreous material, is characterized in that one of the lamellar elements is an inset plate, the thickness of which is slightly greater than that of the solar cells and which is provided with recesses in which such cells are accommodated. The inset plate consists of a synthetic resin having a softening point above 70° C.; and the adhesive comprises a synthetic resin formed by polymerizing a suitable monomer at a temperature below 70° C.

The generator panel according to the invention has the advantage that its stability is very good even under the most severe climatological conditions.

The plates of glass or other vitreous material which are used as the external surfaces of the assembly are completely water-tight. In addition, the very good long-term cohesion of the various elements of the assembly especially at the circumference is advantageous.

According to the invention, this increased stability is due to the association of synthetic resins whose flexibility is thermally stable, with the rigid materials such as the glass and the semiconductor material constituting the cells, the coefficients of expansion of which are very different. In fact, this combination permits of free absorption of thermal loads without particularly large stresses occurring which could result in cracking or loosening, thereby permitting lateral penetration of moisture into the laminated assembly to occur.

In a preferred embodiment of the invention the generator panel is further characterized in that the inset plate and at least one additional inset film which separates the inset plate with the cells from at least one of the external vietreous plates consist of a transparent material selected from polyesters, methacrylates, epoxy resins, silicone rubbers, epoxy acrylate resins, and polyester acrylate resins.

In a preferred embodiment of the invention advantageously the adhesive used for assembling the laminated assembly is a synthetic resin selected from the above-mentioned materials for the inset plate and the inset film, namely: polyesters, methacrylates, epoxide resins, silicone resins, epoxy acrylates, and polyester acrylate resins.

The invention relates in addition to a method of manufacturing a generator panel having the above-mentioned features, which is characterized in that two sub-assemblies of the panels are formed, one sub-assembly comprising at least the inset plate and a number of solar cells, the surface to be fixed to the other sub-assembly being coated with a uniformly distributed layer of the adhesive. The two sub-assemblies are introduced into an evacuated space, with the surfaces to be combined being situated at some distance from each other. The sub-assemblies are then subjected to a considerable negative pressure which is produced in the evacuated space and, while such negative pressure is maintained, the surfaces to be combined are contacted with each other and held together by means of a compressive force which is exerted on the assembly while the adhesive hardens.

The negative pressure produced in the evacuated space advantageously results in a residual pressure of less than 1000 Pascal during the contacting of the surfaces to be combined.

The method according to the invention has the advantage that panels can be built in a simple manner in which reproducible results of high quality are obtained. Moreover, this process can easily be used for series production.

Figure 2:
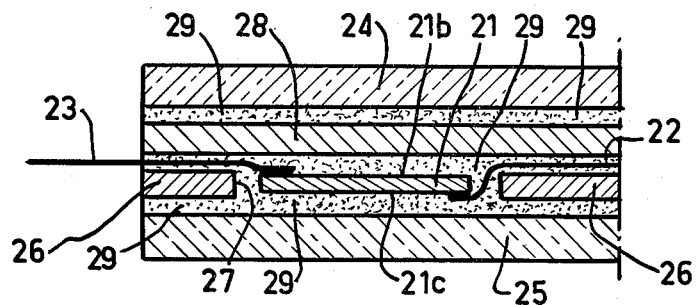
Figure 3:
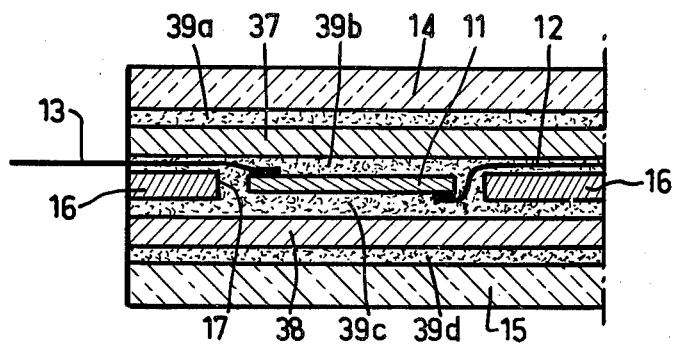
Figure 4:
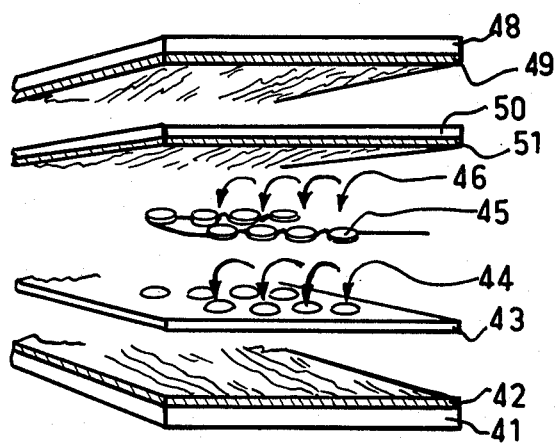
Figure 5:
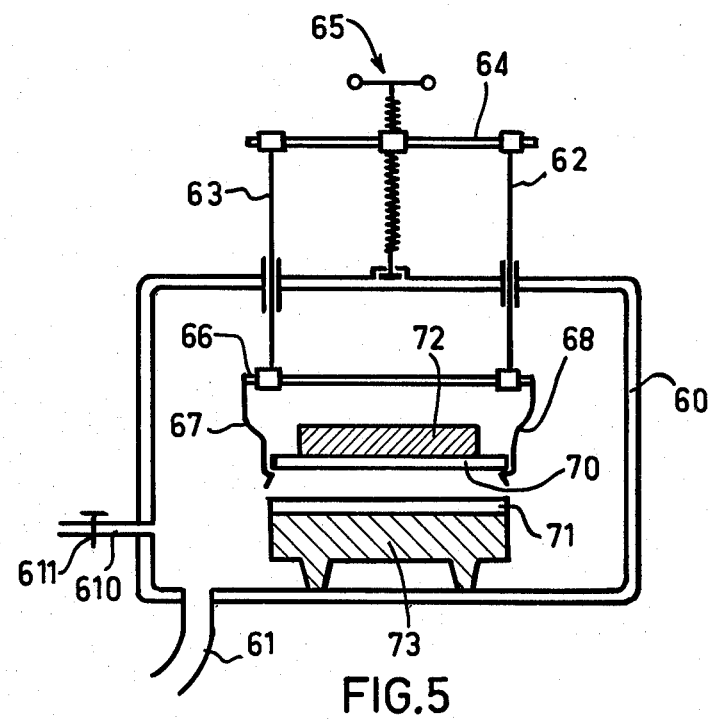

The invention will now be described in greater detail in connection with the accompanying drawing, in which:

FIG. 1 is a diagrammatic partial sectional view through a generator panel according to a first embodiment of the invention including an inset plate having recesses, FIG. 2 is a partial sectional view through a panel in accordance with a second embodiment including in addition an inset film, FIG. 3 shows a partial sectional view of a third embodiment of a panel according to the invention including in addition two inset films, FIG. 4 shows in perspective the elements of the panel during the assembly thereof, and FIG. 5 illustrates the method according to the invention.

As shown in FIG. 1, the photovoltaic generator panel includes a number of solar cells in the form of discs of a semiconductor material, preferably silicon, of which one is denoted by 11 and which is provided with an electric connection 12 which connects it to another cell of the assembly, and a connection 13 which leads to the exterior of the panel. The panel comprises glass plates 14 and 15 forming the external elements of the laminated assembly in which the cells, for example cell 11, are incorporated. According to the invention, the laminated assembly is completed by an inset plate 16 which has recesses (such as 17) in which each of the cells (such as 11) is respectively accommodated. The thickness of the inset plate 16 is slightly larger than that of the cell 11 so that the plates 14 and 15 can in no case exert a direct pressure on the cell 11. According to the invention the material forming the inset plate has a hardness which is substantially stable at temperatures above and below the normal ambient temperature, and in particular up to 70° C. The cohesion of the laminated panel assembly according to the invention is obtained by means of an adhesive 19 which occupies all of the intermediate spaces which are left free inside the laminated assembly between the plates 14 and 15. In this manner the adhesive 19 ensures a mechanical connection between the inset plate 16 and each of the plates 14 and 15 and also between the cell 11 with its connections 12 and 13 and plates 14 and 15. In addition, due to its thermal conductivity, the adhesive 19 permits a favorable dissipation of the heat produced by absorption of the radiation in the cell to the plates 14 and 15 and then to the ambient air. Finally, the adhesive 19 is a material which is transparent to visible light and ensures, by its index of refraction approaching that of glass, the necessary optical continuity within the laminated assembly up to the photosensitive surface of the cell 11. In this manner, efficiency losses due to stray reflections of the light at the interfaces between the various materials forming the laminated assembly are avoided. According to the invention the adhesive 19 is a material which has been polymerized at ambient temperature and at any rate at a temperature which does not exceed 70° C. Thus, the elements forming the panel, the coefficients of expansion of which are different from each other, can exert only strongly reduced loads both during the polymerization and subsequently under the practical operating conditions, which loads cannot produce ruptures of the adhesive in the assembly. Advantageously the adhesive 19 is a flexible material which maintains very stable mechanical properties and temperatures above and below ambient temperature and in particular between 0° and 70° C.

It is to be noted that the expression "glass plate" has been used for the plates 14 and 15 which form both the protection of the cells and the rigid element or elements of the laminated assembly; but this term includes more generally vitreous or vitrocrystalline transparent materials which may or may not have been subjected to a particular thermal treatment.

However, as is known already, a glass or a vitreous material is advantageously chosen which absorbs solar radiations in the ultraviolet range, which radiations on the one hand are not fully converted by the known solar cells and on the other hand may attack certain synthetic resins which may be used as a lamellar element in the formation of the laminated assembly.

The inset plate 16 is advantageously formed by a material which is flexible over a large temperature range around the normal ambient temperature and in particular up to 70° C. and which does not soften excessively either. In addition, the inset plate 16 advantageously comprises a transparent material whose absorption of light is limited substantially to the range utilized by the solar cells so that heating of the panel is reduced.

In the embodiment shown in FIG. 2, a solar cell 21 of a semiconductor material is similarly provided with electrical connections 22 and 23 and is arranged in a recess 27 of an inset plate 26 within a laminated assembly whose external lamellar elements are formed by the glass plates 24 and 25.

The panel shown in FIG. 2 furthermore includes an inset film 28 which advantageously is formed of a synthetic resin, the hardness of which is stable at least up to 70° C.

As shown in FIG. 2, the inset film 28 fully separates the inset plate 26 and the cell 21 from the glass plate 24. This construction provides the advantage that, while taking into account the nature of the material forming the inset film 28, the interior of the laminated assembly is given an additional flexibility opposing the stresses which are dangerous for the cell 21 which in general is rather fragile. One of the principal surfaces of the cell 21 is the photosensitive surface which comprises the superficial electric region, the conductivity type of which is opposite to that of the remainder of the semiconductor material. This photosensitive surface may be arranged on the side of the cell which is denoted in FIG. 2 by 21b, that is to say, on the side adjoining the inset film 28; and in this case a material is chosen for the formation of the inset film 28 which is transparent to the light radiation which is used for the cell, that is, a material which in principle is transparent to visible radiation. The photosensitive surface of the cell may alternatively be arranged on the side which is denoted by 21c; in this case the material forming the inset film 28 is not necessarily transparent to the visible light. In a preferred embodiment of the panel shown in FIG. 2 the inset film 28 is formed of the same material as the inset plate 26.

The cell 21 and the lamellar elements forming the laminated assembly shown in FIG. 2 are assembled and held together by means of the adhesive 29. According to the invention, the adhesive 29 consists of a transparent material that has been activated with respect to its adhering function by having been polymerized at a temperature which is near normal ambient temperature, and not exceeding 70° C., as already described with reference to FIG. 1.

In the embodiment of the invention shown in FIG. 3, inset plate 16 is centrally located in the laminated assembly with the cells 11 accommodated in the recesses 17 is separated from the glass plates 14 and 15 by the inset films 37 and 38, respectively, of a synthetic resin which is stable up to at least 70° C., one of the inset films 37 and 38 which adjoins the photosensitive surface of the cell 11 being transparent. The elements of the laminated assembly are held together in a coherent manner by means of an adhesive which is divided into four layers, namely, the layer 39a which connects the inset film 37 to the plate 14; the layer 39b which connects the inset film 37 with one side of each of the inset plate 16 and the cell 11; the layer 39c which connects the opposite sides of the same elements to the inset film 38; and finally the layer 39d which connects the inset film 38 to the plate 15.

According to the invention, the adhesive of the layers 39a to 39d consists of a transparent material which has been polymerized at a temperature which is near normal ambient temperature. In addition, the adhesive advantageously is a material which is rather flexible after polymerization so that the effects of thermal expansion of the rigid elements of the laminated assembly can be absorbed without difficulty by the plastic elements.

In a preferred embodiment of the invention, the inset plate and the inset film(s) are made from a material which is transparent to sunlight. More precisely, the inset plate 26 and the inset film 28 of FIG. 2 or the inset plate 16 and the inset films 37 and 38 of FIG. 3 are made of the same transparent material. Thus, the panel does not fully absorb the solar radiation in the zones which are not occupied by the cells. This feature is advantageous because it provides a reduction in the temperature rise under the influence of the radiation during operation. It has been found that the degree of radiation conversion of the solar cells is thus improved.

Further, in the examples of FIGS. 2 and 3 in which several lamellar inset examples are used, the selection and the mutual compatibility problems of the various materials, notably in relation to the adhesive used, are simplified by the choice of the same composition for said elements.

The thickness of the elements forming the laminated assembly may be varied within wide limits without objections, as will be indicated, and also in accordance with the type of application and the stresses which the panels should be capable of resisting. Thus, the thickness of the plates of glass or of vitreous material is typically chosen in a range of 2 mm to 10 mm in accordance with the surface area of the panels and the mechanical rigidity envisaged for these panels. When the solar cells have a thickness in the proximity of 0.25 mm, the thickness of the inset plate with recesses, namely, 16 in FIGS. 1 and 3 or 26 in FIG. 2, is advantageously chosen to be slightly greater, taking into account the thickness of the metallic connection lugs which are soldered on each face of the cell. Said thickness is, for example, on the order of 0.3 to 0.5 mm.

In the modified embodiments of the invention shown in FIGS. 2 and 3, the thickness of inset film 28 (FIG. 2) or insert films 37 and 38 (FIG. 3) ranges from 0.05 mm to 1.5 mm; 0.2 to 0.8 mm being preferred.

In the manufacture of a photovoltaic generator panel according to the invention, as shown in FIG. 4, a surface of a first glass plate 41 is coated with a thin, even layer of a liquid adhesive 42. The inset plate 11 with recesses 43 is then fixed on plate 41 by means of the layer of adhesive 42 from which all air inclusions can easily be driven out by exerting a pressure by means of, for example, a roller. Approximately in the center of each recess, a certain quantity of adhesive is deposited on the plate 41 which is added to the layer 42. This operation is shown diagrammatically by the arrows 44. The complete network of cells 45 which are connected in an arrangement which corresponds to the recesses of the inlet plate 43 is deposited in the recesses containing the excess of adhesive while a new quantity of adhesive is again deposited approximately in the center of each cell, which operation is shown diagrammatically by the arrows 46. The additional quantity of adhesive is distributed over all the cells in such manner that the recesses of the inset plate 43 are filled entirely, without interruptions, by the cells and the adhesive. A very small excess of adhesive may be present.

The first subassembly so obtained is placed in a horizontal position while a surface of the second glass plate 48 is coated with a thin layer adhesive 49. An inset film 50 is then provided by pressure on the coated surface of the plate 48, after which the outer surface of the inset film 50 is coated with a layer of adhesive 51. In this manner a second sub-assembly which is complementary to the first is obtained which is destined to be provided on the first sub-assembly by pressure in such manner that the surface coated with the layer of adhesive 51 is opposite to the network of cells 45 and the inset plate 43.

Optimum results are achieved when the process of combining the two sub-assemblies is carried out in a vacuum so that no discontinuities are present in the layers of adhesive and no air inclusions are obtained in the laminated assembly. For that purpose, according to the invention, the two sub-assemblies are arranged within a chamber in a horizontal position parallel to each other in such manner that the surfaces to be adhered do not touch each other but are situated opposite to each other, said chamber being connected with pumping means and further having moving means which can be controlled from the exterior while the chamber is evacuated. The chamber is then evacuated and, when the residual pressure has dropped below 1000 Pascal, the two oppositely located parts are combined; these parts are then held together by exerting, for example, a load. The vacuum in the chamber may then be released, and the panel may be removed from the chamber while still held together under the action of the load. After the adhesive has been polymerized, the pressure exerted on the panel is removed. In a modified embodiment of the method according to the invention, a panel laminated under the influence of pressure is left in the vacuum space during the period of time required for polymerization of the adhesive.

A device for carrying out the assembly of the panel in a vacuum is shown in FIG. 5. It comprises a chamber 60 provided with an evacuation tube 61 which leads to a vacuum pump (not shown) and an air inlet 610 having valve 611. The chamber 60 also includes displacement means controlled from the exterior and formed by pins 62 and 63 which slide in a water-tight manner through the wall of the chamber and which are connected together by means of a brace 64, the height of which can be varied by means of the adjusting screw 65, and frame 66, reproducing the movement of the brace 64 inside the chamber 60. The frame 66 has supporting arms 67 and 68 which keep the sub-assembly 70 spaced from the sub-assembly 71 until the vacuum in the chamber is produced. Pressure can be exerted on the assembly in the final stage of the method by load 72. Finally, support 73 serves to maintain the sub-assembly 71 parallel to and at a small distance from the sub-assembly 70 in the desired position.

The sub-assembly 71 which rests on the support 73 is the sub-assembly which comprises the inset plate with recesses, the network of cells, and the excess of adhesive mentioned above (these details are not shown in FIG. 5).

During lamination, when the sub-assembly 70 is contacted with the sub-assembly 71, the excesses of adhesive are distributed by the pressure exerted on the assembly over the whole vacuum of the recesses and fully surround the cells. The small excess of adhesive automatically fills any intermediate spaces in the adhesive layers. This procedure can be further facilitated when the sub-assembly 70 is slightly curved under the action of the load 72 provided centrally and by the supporting plates 67 and 68 retaining the circumference.

The structure of the panel so obtained corresponds to the device shown in FIG. 2. This method can be modified in a simple manner so that a structure is obtained which is equivalent to that of FIG. 1 if the inset film 50 and its layer of adhesive 51 (FIG. 4) are omitted so that the second sub-assembly which is to be provided on the first sub-assembly containing the cells then comprises only the glass plate 48 which is coated with its layer of adhesive 49.

The structure shown in FIG. 3 is obtained when an additional inlet film is provided between the plate 41 and the inset plate 43, the additional inset film being coated with adhesive in the manner described for the inset film 50 and the glass plate 48.

According to the method of the invention, panels can be assembled, the rigidity and optical properties of which are very favorable. The panels obtained may be given a circumferential ring for protection against shocks, which ring is advantageously flanged and can exert a certain pressure on the external faces along the circumference of the glass plates.

What is claimed is:

1. A photovoltaic generator panel which comprises a plurality of lamellar elements, the two external lamellar elements being formed of a vitreous material, at least one of said vitreous material lamellar elements being transparent; an inner lamellar element provided with a plurality of openings, said inner lamellar element being formed of a synthetic resin having a softening temperature above 70° C.; a solar cell positioned in each such opening, the thickness of the inner lamellar element being slightly greater than that of the solar cells; and a transparent adhesive bonding said lamellar elements and said solar cells together, said adhesive being a synthetic resin formed from a monomer polymerized at a temperature below 70° C.

2. A generator panel according to claim 1 wherein the synthetic resin forming said adhesive is the same as the synthetic resin forming said inner lamellar element.

3. A generator panel according to claim 2 wherein an additional lamellar element formed of a synthetic resin having a softening temperature above 70° C. fully separates said inner lamellar element and said solar cells from one of said vitreous material lamellar elements.

4. A generator panel according to claim 3 wherein a second additional lamellar element formed of a synthetic resin having a softening temperature above 70° C. also fully separates said inner lamellar element and said solar cells from the other vitreous material lamellar element, at least one of said additional lamellar elements being transparent.

5. A generator panel according to claim 4 wherein one or both of said additional lamellar elements is formed of the same synthetic resin as the inner lamellar element.

6. A generator panel according to claim 5 wherein said synthetic resin is selected from the group consisting of transparent polyesters, methacrylates, epoxide resins, silicone rubbers, epoxyacrylates, and polyester acrylates.

* * * * *